US007859113B2

(12) United States Patent
Edelstein et al.

(10) Patent No.: US 7,859,113 B2
(45) Date of Patent: Dec. 28, 2010

(54) STRUCTURE INCLUDING VIA HAVING REFRACTORY METAL COLLAR AT COPPER WIRE AND DIELECTRIC LAYER LINER-LESS INTERFACE AND RELATED METHOD

(75) Inventors: Daniel C. Edelstein, White Plains, NY (US); Takeshi Nogami, Schenectady, NY (US); Ping-Chuan Wang, Hopewell Junction, NY (US); Yun-Yu Wang, Poughquag, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 11/679,483

(22) Filed: Feb. 27, 2007

(65) Prior Publication Data

US 2008/0203570 A1 Aug. 28, 2008

(51) Int. Cl.
*H01L 23/48* (2006.01)

(52) U.S. Cl. ............... 257/774; 257/775; 257/E21.585; 257/E23.145; 257/E23.153

(58) Field of Classification Search .......... 257/E21.579, 257/E21.585, E23.145, E23.152, 774; 438/638–639
See application file for complete search history.

(56) References Cited

U.S. PATENT DOCUMENTS 5,585,673 A 12/1996 Joshi et al.
5,695,810 A 12/1997 Dubin et al.
6,046,104 A * 4/2000 Kepler ........................ 438/637
6,159,851 A * 12/2000 Chen et al. .................. 438/669
6,323,554 B1 11/2001 Joshi et al.
6,333,560 B1 12/2001 Uzoh
6,342,733 B1 1/2002 Hu et al.
6,522,013 B1 * 2/2003 Chen et al. .................. 257/774
6,613,664 B2 * 9/2003 Barth et al. ................. 438/629
6,908,847 B2 * 6/2005 Saito et al. .................. 438/627
7,122,462 B2 10/2006 Clevenger et al.
2003/0100181 A1 * 5/2003 Park et al. ................... 438/639
2004/0102035 A1 5/2004 Lee
2004/0113279 A1 6/2004 Chen et al.
2005/0275110 A1 * 12/2005 Maekawa et al. ........... 257/760

* cited by examiner

*Primary Examiner*—Hsien-ming Lee
*Assistant Examiner*—Kevin Parendo
(74) *Attorney, Agent, or Firm*—Katherine S. Brown; Hoffman Warnick LLC

(57) ABSTRACT

Structures including a refractory metal collar at a copper wire and dielectric layer liner-less interface, and a related method, are disclosed. In one embodiment, a structure includes a copper wire having a liner-less interface with a dielectric layer thereabove; a via extending upwardly from the copper wire through the dielectric layer; and a refractory metal collar extending from a side of the via and partially along the liner-less interface. Refractory metal collar prevents electromigration induced slit voiding by improving the interface around the via, and prevents void nucleation from occurring near the via. Also, the refractory metal collar provides electrical redundancy in the presence of voids around the via and dielectric layer liner-less interface.

15 Claims, 4 Drawing Sheets

STRUCTURE INCLUDING VIA HAVING REFRACTORY METAL COLLAR AT COPPER WIRE AND DIELECTRIC LAYER LINER-LESS INTERFACE AND RELATED METHOD

BACKGROUND

1. Technical Field

The disclosure relates generally to integrated circuit (IC) chip fabrication, and more particularly, to structures including a via having a refractory metal collar at a copper wire and dielectric layer liner-less interface, and a related method.

2. Background Art

In the integrated circuit (IC) chip fabrication industry, electromigration (EM) induced failure is a major concern for advanced back-end-of-line (BEOL) technology. Early EM induced failure, in particular, significantly reduces the projected current limit of product chip under operating conditions. One type of EM induced failure is referred to as "line-depletion." As shown in FIGS. 1A-C, line-depletion EM includes electron current flowing from an upwardly extending via 10 down into a metal wire 12 below. As electron current flows, atoms move causing "slit void" failures 14 (FIG. 1C) initiating, for example, at a site 16 (FIG. 1B) between via 10 and a liner-less interface 18 between metal wire 12 and a dielectric layer 20 thereabove. It is well known that this slit void may cause very early fails under electromigration conditions during circuit operation, since it does not take much time to form such a small void. The arrows in FIGS. 1A and 1B show the direction of EM flux (i.e., the atom flow during electromigration). Typically, slit void failures 14 (FIG. 1C) start (or nucleate) at defective sites 16 (FIG. 1B) around an interface between via 10 and metal wire 12, and grow into a bottom 22 of via 10 until it extends over an entire interface and causes an electrical open 24, as depicted in FIG. 1C. Slit void failures 14 occur in both structures with (as shown) or without via gouging, i.e., where via 10 extends into metal wire 12.

SUMMARY

Structures including a refractory metal collar at a metal wire and dielectric layer liner-less interface, and a related method, are disclosed. In one embodiment, a structure includes a copper wire having a liner-less interface with a dielectric layer thereabove; a via extending upwardly from the copper wire through the dielectric layer, and a refractory metal collar extending from a side of the via and partially along the liner-less interface. Refractory metal collar prevents electromigration induced slit voiding by improving the interface around the via, and prevents void nucleation from occurring near the via. Also, the refractory metal collar provides electrical redundancy in the presence of voids around the via and dielectric layer liner-less interface.

A first aspect of the disclosure provides a structure comprising: a copper wire having a liner-less interface with a dielectric layer thereabove; a via extending upwardly from the copper wire through the dielectric layer; and a refractory metal collar extending from a side of the via and partially along the liner-less interface.

A second aspect of the disclosure provides a method comprising: providing a copper wire in a first dielectric layer; forming a second dielectric layer over the copper wire to form a liner-less interface between the copper wire and the second dielectric layer; forming an opening through the second dielectric layer and into the copper wire; creating an undercut from the opening under the second dielectric layer; forming a refractory metal collar in the undercut; and filling the opening with a metal to form a via.

A third aspect of the disclosure provides a structure comprising: a copper wire having a liner-less interface with a dielectric layer thereabove; a via extending upwardly from the copper wire through the dielectric layer, the via including a substantially frusto-conical portion within the copper wire; a first liner about the via, the first liner including a refractory metal; and a refractory metal collar extending from a side of the via and partially along the liner-less interface.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 2:
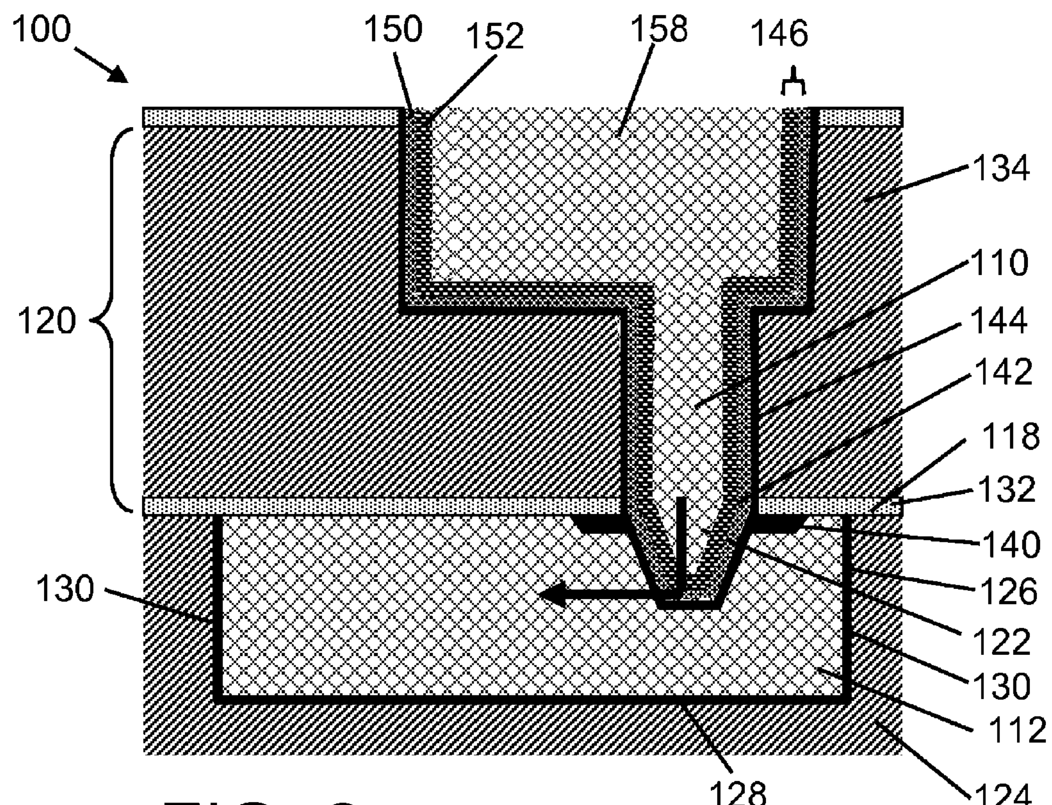
FIG. 2 shows a structure according to embodiments of the disclosure.

FIG. 2 shows a structure 100 according to embodiments of the disclosure. Structure 100 includes a via 110 extending upwardly from a metal wire 112, e.g., copper, through a dielectric layer 120. In one embodiment, via 110 includes a substantially frusto-conical portion 122 within metal wire 112. However, the teachings of the invention are not limited to that type of via. Metal wire 112 is positioned within another dielectric layer 124, and includes a liner 126 between metal wire 112 and dielectric layer 124. Liner 126 may include any now known or later developed metal diffusion barrier material, for example, tantalum, tantalum nitride, titanium, titanium nitride, tungsten, tungsten nitride, ruthenium, ruthenium nitride, etc. Note, however, liner 126 separates metal wire 112 and dielectric layer 124 along only a bottom 128 and sides 130 of metal wire 112. Accordingly, metal wire 112 includes a liner-less interface 118 with dielectric layer 120 thereabove.

Dielectric layer 120 includes a barrier layer 132 forming liner-less interface 118 with metal wire 112, and an interlevel dielectric 134 above barrier layer 132. Barrier layer 132 may include any now known or later developed dielectric barrier layer such as silicon carbide (SiC), silicon nitride ($Si_3N_4$) silicon dioxide ($SiO_2$), nitrogen or hydrogen doped silicon carbide (SiC(N,H)), etc. Interlevel dielectric 134 may include any now known or later developed porous or non-porous interlevel dielectric material, such as silicon oxide, silicon nitride, hydrogenated silicon oxycarbide (SiCOH), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), JSR (a spin-on silicon-carbon contained polymer material available form JSR Corporation), other low dielectric constant (<3.9) material, or layers thereof.

Structure 100 also includes a refractory metal collar 140 extending from a side 142 of via 110 and partially along liner-less interface 118. In addition, a first liner 144 may be formed about via 110, first liner 144 including the same refractory metal. In one embodiment, the refractory metal includes ruthenium; however, other refractory metals such as tantalum (Ta), titanium (Ti), tungsten (W), iridium (Ir), rhodium (Rh) and platinum (Pt), etc., or mixtures of thereof, may also be employed. Via 110 may also include a second liner 146 about the via, where second liner 146 includes at least one metal diffusion barrier 150 (i.e., liner) and a metal seed layer 152 for seeding for a metal 158 that forms via 110. In one embodiment, metal 158 includes copper; however, other metals such as copper alloy, aluminum (Al), aluminum alloy, silver (Ag), etc. may be employed. Metal diffusion barrier(s) 150 may include, for example: tantalum/tantalum nitride titanium/titanium nitride, tungsten/tungsten nitride, ruthenium/ruthenium nitride. etc.; and metal seed layer 152 may include copper (Cu) or other alloy materials, where metal 158 is copper, for example: copper, copper aluminum, and other copper alloy such as copper iridium, copper nickel, and/or copper ruthenium.

Figure 1A:
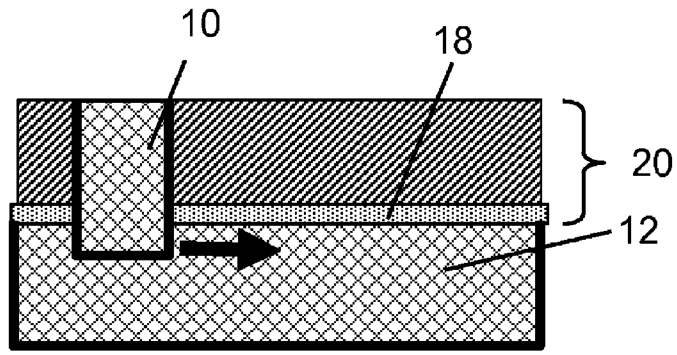
FIGS. 1A-C show a conventional via and metal wire interface in which electromigration causes a failure.
Figure 1B:
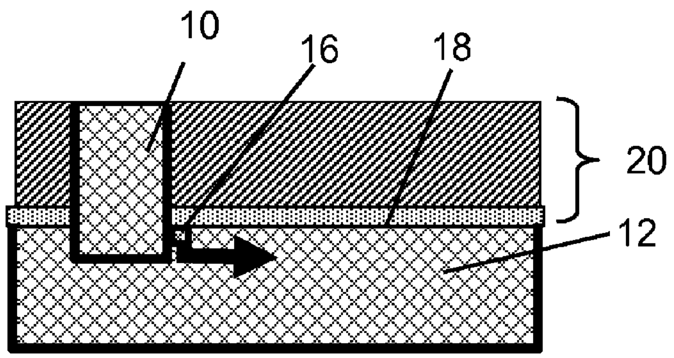
Figure 1C:
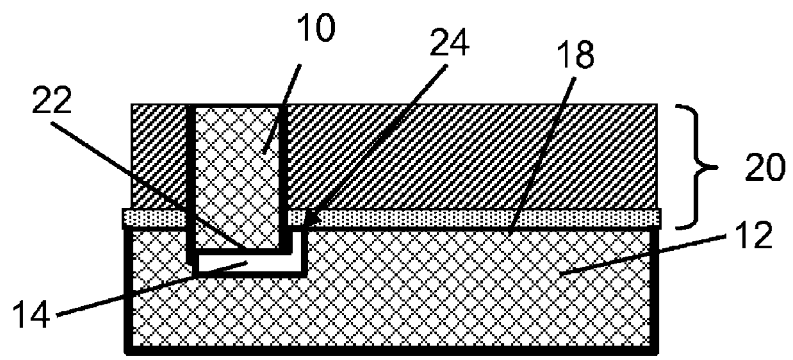

Refractory metal collar 140 and metal wire 112 interface presents a slow electromigration (EM) path in which the EM flux (i.e., the atom flow during electromigration) is forced down, as shown by the arrow, into metal wire 110 instead of concentrating near liner-less interface 118 (as in FIGS. 1A-B). In particular, the interface between metal wire 112 (e.g., of copper) and refractory metal collar 140 is very resistant to electromigration-induced voiding, since the adhesion at the interface is greatly enhanced compared to that between metal and dielectric-based barrier layer 132 materials. As a result, the local EM flux at liner-less interface 118 around via 110 is greatly reduced. Also, since refractory metal collar 140 is formed only around via 110, but not directly under via 110 and metal wire 112 contact, the via contact resistance is not impacted by this feature. Refractory metal collar 140 around via 110 also serves as a redundant conducting path, even if a void forms underneath via 110, thus preventing structure 100 from being electrically open.

Structure 100 also decreases thermal cycle failure. Thermal cycle testing is a required reliability test reflecting the temperature excursion experienced by the product. Due to mismatch in thermal expansion between metal and its surrounding dielectric(s), fatigue or cracks may occur at the via and metal wire interface, causing an electrical open. Refractory metal collar 140 (mechanically much stronger than copper) serves as an anchor to keep via 110 from pulling out of metal wire 110 under stress.

Figure 3:
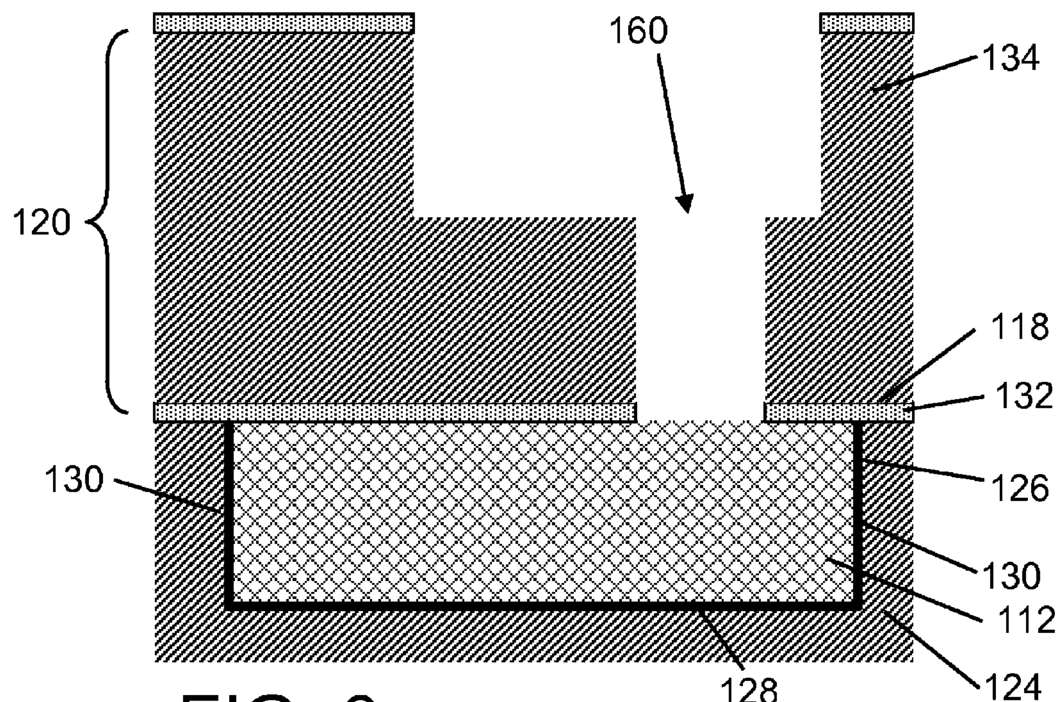
FIGS. 3-7 show embodiments of a method of forming the structure of FIG. 2.

Turning to FIGS. 3-7, embodiments of a method of forming structure 100 (FIG. 2) will now be described. It is understood that a variety of methods may be employed and that the following is one example. In FIG. 3, metal wire 112 is provided in dielectric layer 124 using any now known or later developed techniques. For example, depositing dielectric layer 124 on a substrate (not shown), photolithography include patterning a mask (not shown), etching the mask, etching an opening, depositing liner 126, depositing a metal (wire 112), and chemical mechanical polishing (CMP). As noted above, liner 126 separates metal wire 112 from dielectric layer 124 along only a bottom 128 and sides 130 of metal wire 112.

FIG. 3 also shows forming dielectric layer 120 over metal wire 112 (and dielectric layer 124) to form liner-less interface 118 between metal wire 112 and dielectric layer 124. As noted above, dielectric layer 120 may include a dielectric barrier layer 132 (e.g., of silicon nitride) forming liner-less interface 118 with metal wire 112, and interlevel dielectric 134 (e.g., SiCOH) above dielectric barrier layer 132. FIG. 3 also shows forming an opening 160 through dielectric layer 134 and dielectric barrier layer 132 to metal wire 112. Although opening 160 is shown as having been formed using a dual damascene process, it is understood that a via opening alone (single damascene process) may be used. Opening 160 may also extend into metal wire 112, if desired.

Figure 4:
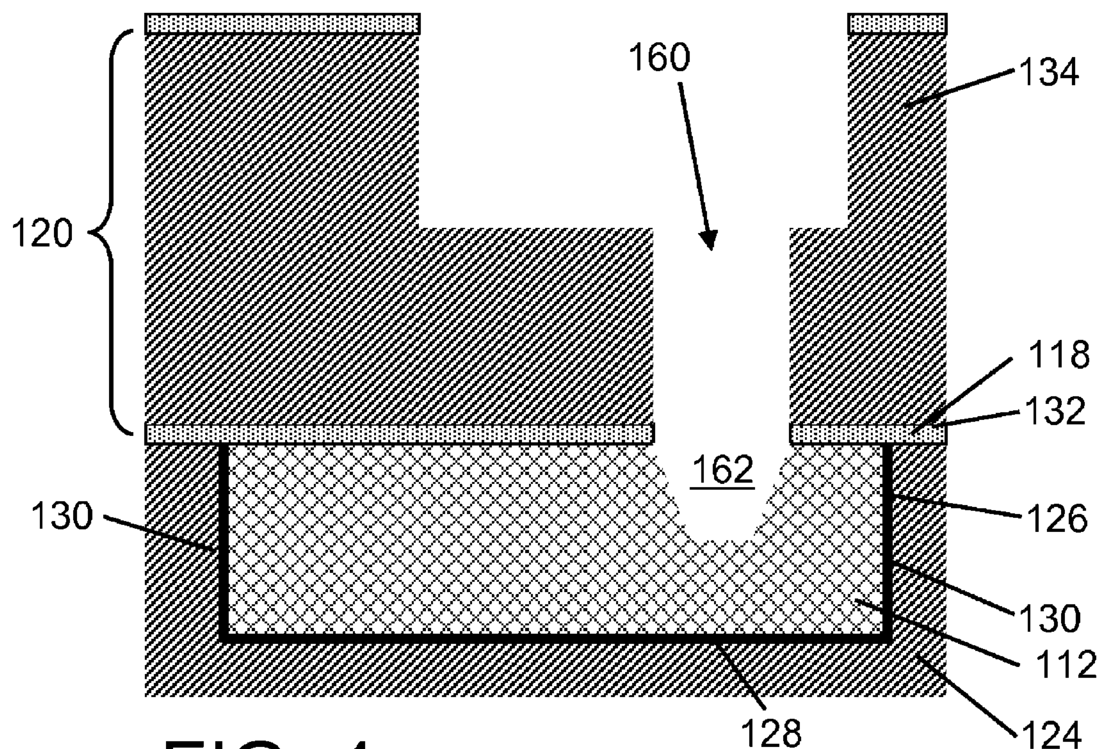

FIG. 4 shows an optional process of a gaseous sputtering process to extend opening 160 into metal wire 112. The gas used in the sputtering process may comprise one of argon (Ar), helium (He), neon (Ne), xenon (Xe), nitrogen ($N_2$), hydrogen ($H_2$), ammonia ($NH_3$), diazene ($N_2H_2$) or mixtures thereof, and preferably comprises Ar. A substantially frustoconical opening 162 results within metal wire 112.

Figure 5:
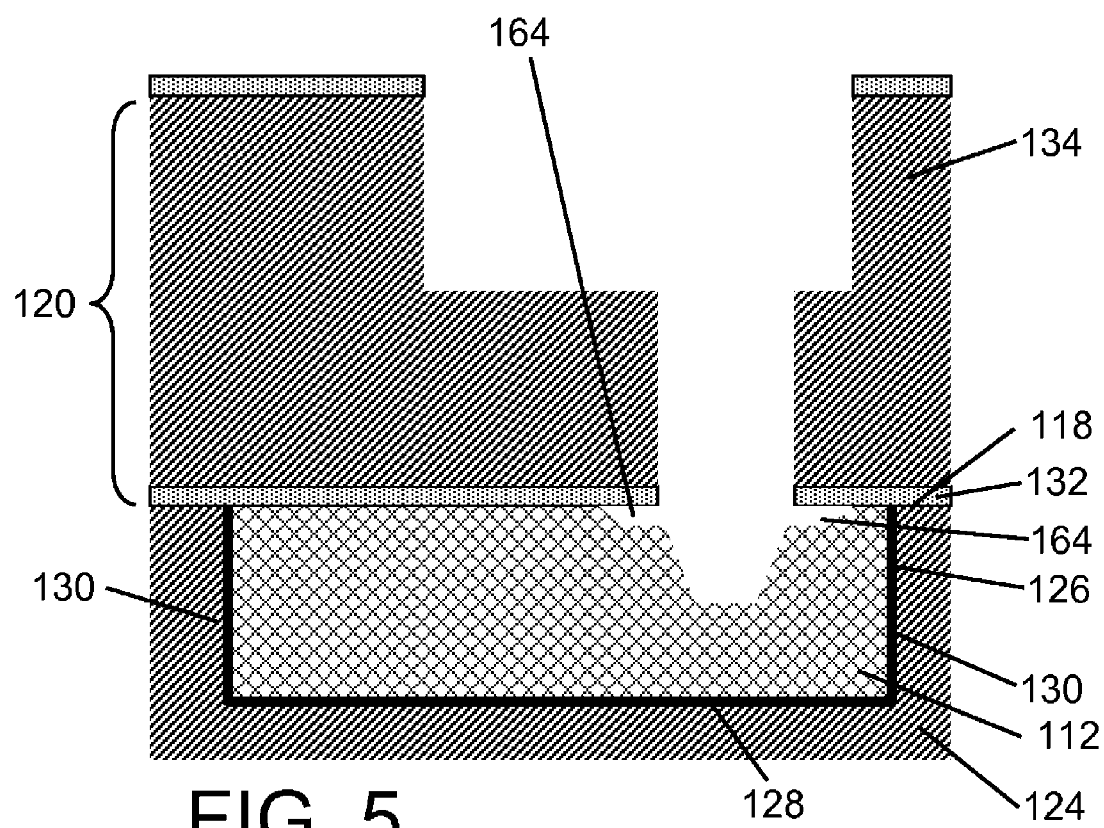

FIG. 5 shows creating an undercut 164 from opening 160 under dielectric layer 120, i.e., under dielectric barrier layer 132. In one embodiment, the undercutting may include performing an isotropic wet/dry etching.

Figure 6:
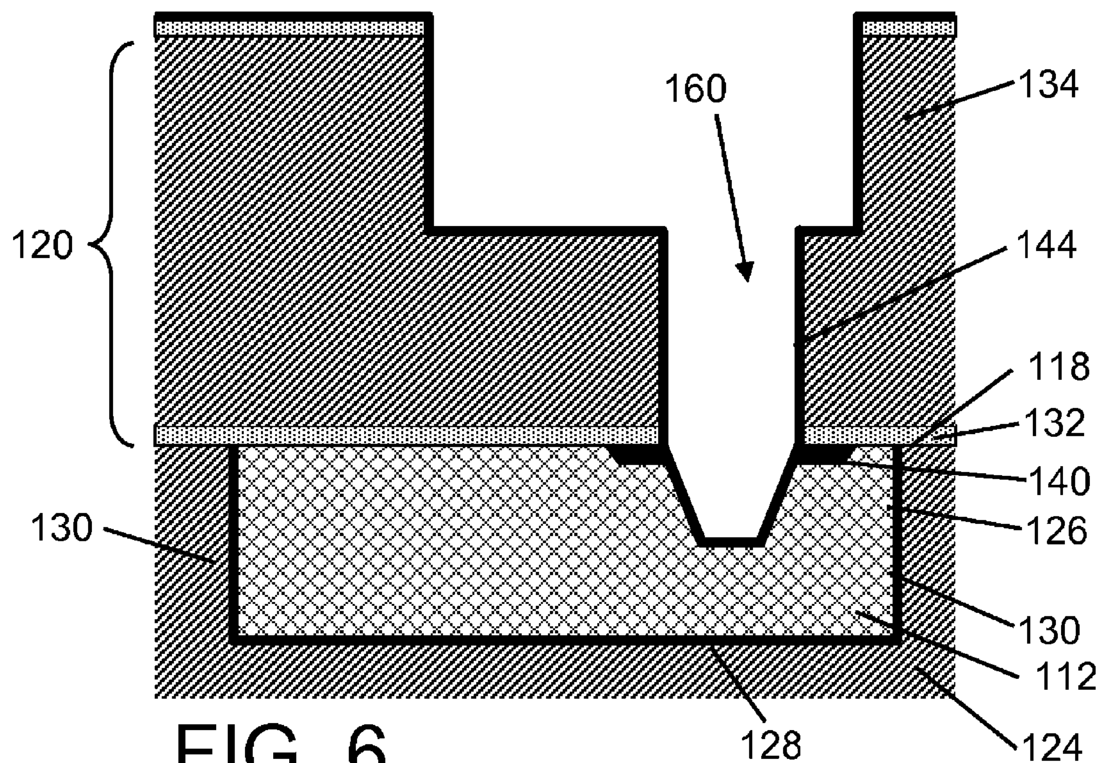

FIG. 6 shows forming refractory metal collar 140 in undercut 164 (FIG. 5), e.g., by atomic layer deposition (ALD) and/or chemical vapor deposition (CVD). As noted above, the refractory metal may include titanium (Ti), tantalum (Ta), tungsten (W), ruthenium (Ru), iridium (Ir), rhodium (Rh) and/or platinum (Pt), etc., or mixtures of thereof. FIG. 6 also shows forming first liner 144 within opening 160 prior to filling opening 160 with a metal (FIG. 2). In this case, first liner 144 may include refractory metal used for refractory metal collar 130.

Figure 7:
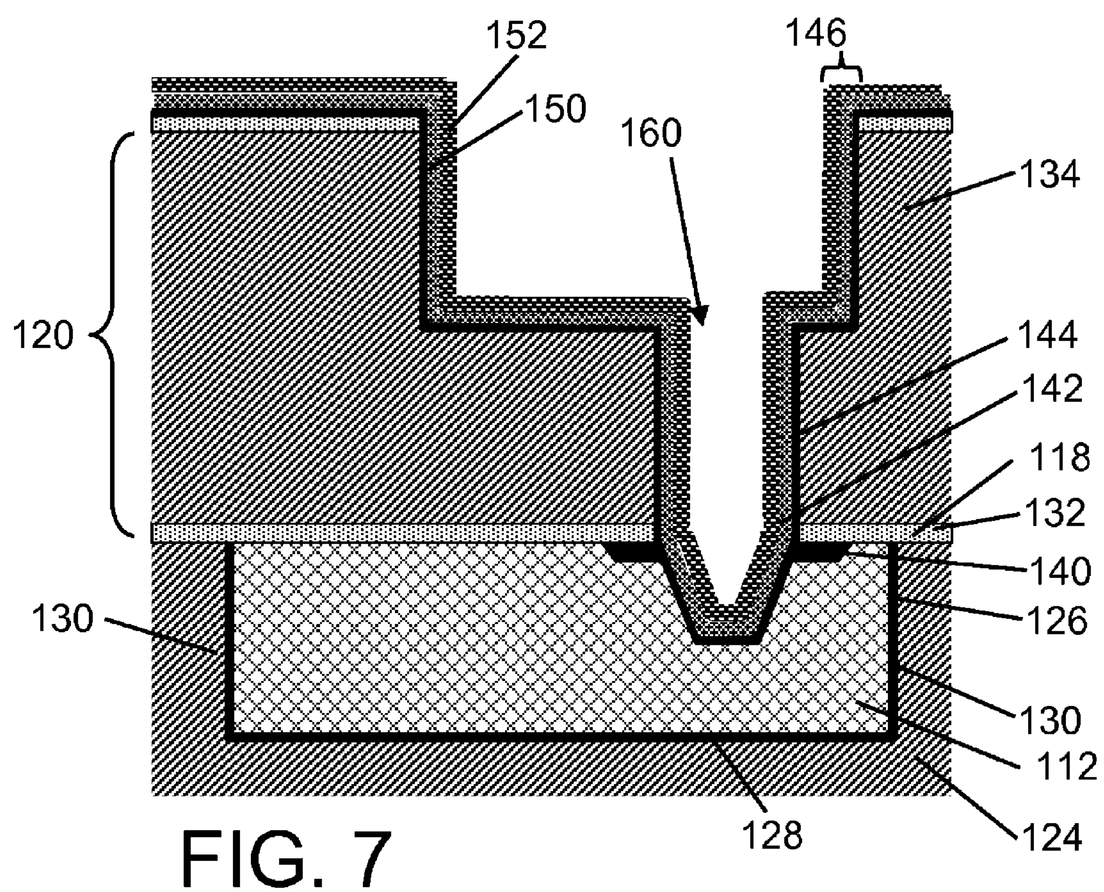

FIG. 7 shows forming second liner 146 within opening 160 prior to filling opening 160 with a metal. As noted above, second liner 146 may include at least one metal diffusion barrier 150 (i.e., liner) and metal seed layer 152. As noted above, metal diffusion barrier(s) 150 may include, for example: tantalum/tantalum nitride, titanium/titanium nitride, tungsten/tungsten nitride, ruthenium/ruthenium nitride, etc. As also noted above, where metal 158 (FIG. 2) is copper, metal seed layer 152 may include, for example: copper, copper aluminum, and other copper alloy such as copper iridium, copper nickel, and/or copper ruthenium.

Returning to FIG. 2, filling opening 160 (FIG. 7) with a metal 158, e.g., metal such as copper, to form via 110, along with any necessary planarization finishes structure 100. It is understood that the teachings of the disclosure may be repeated numerous times within a level of an IC chip and numerous times for different levels of the IC chip.

The structures and methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A structure comprising:

a metal wire having a liner-less interface;

a dielectric layer located above the liner-less interface of the metal wire;

a via extending upwardly from the metal wire through the dielectric layer;

a refractory metal collar extending from a side of the via and partially along the liner-less interface, the refractory metal collar having a slit-shaped cross section with a substantially uniform thickness extending downward from the liner-less interface and a substantially uniform width extending radially outward from the side of the via along the liner-less interface, wherein the substantially uniform thickness of the slit-shaped cross section is less than the substantially uniform width of the slit-shaped cross section; and a first liner that is continuous about the via including the bottom of the via and the refractory metal collar, wherein the first liner is provided against an internal wall surface of the via including the bottom of the via, wherein a portion of the internal wall surface of the via is the surface of the dielectric layer, wherein the first liner runs continuously against the internal wall surface of the via as the via extends through the dielectric layer and the metal wire, wherein the first liner includes a second refractory metal that is the same as the refractory metal used in the refractory metal collar.

2. The structure of claim 1, wherein the via includes a substantially frusto-conical portion within the metal wire.

3. The structure of claim 1, wherein the refractory metal is selected from a group consisting of at least one of: tantalum (Ta), titanium (Ti), tungsten (W), ruthenium (Ru), iridium (Ir), rhodium (Rh) and platinum (Pt).

4. The structure of claim 1, further comprising forming a second liner that is provided continuously against the first liner, the second liner including at least one metal diffusion barrier and a metal seed layer.

5. The structure of claim 4, wherein the at least one metal diffusion barrier is selected from a group consisting of: tantalum, tantalum nitride, titanium, titanium nitride, tungsten, tungsten nitride, ruthenium and ruthenium nitride.

6. The structure of claim 4, wherein the metal wire includes copper and the metal seed layer is selected from a group consisting of at least one of: copper, copper aluminum, copper iridium, copper nickel and copper ruthenium.

7. The structure of claim 1, wherein the metal wire is positioned within another dielectric layer, and further comprising a liner between the metal wire and the another dielectric layer.

8. The structure of claim 1, wherein the dielectric layer includes a barrier layer forming the liner-less interface with the metal wire and an interlevel dielectric above the barrier layer.

9. The structure of claim 1, wherein the first liner comprises a single liner layer.

10. The structure of claim 9, wherein the single liner layer is formed from a single deposition process.

11. A structure comprising:

a copper wire having a liner-less interface;

a dielectric layer located above the liner-less interface of the copper wire;

a via extending upwardly from the copper wire through the dielectric layer, the via including a substantially frusto-conical portion within the copper wire;

a first liner that is fully continuous around the via including the bottom of the via through the dielectric layer and the copper wire, wherein the first liner is provided against the internal wall surface of the via including the bottom of the via, wherein a portion of the internal wall surface of the via is the surface of the dielectric layer, wherein the first liner runs continuously against the internal wall surface of the via through the dielectric layer and the copper wire, wherein the first liner includes a refractory metal; and a refractory metal collar extending from a side of the via and partially along the liner-less interface, the refractory metal collar comprising a slit-shaped cross section with a substantially uniform thickness extending downward from the liner-less interface and a substantially uniform width extending radially outward from the side of the via along the liner-less interface, wherein the substantially uniform thickness of the slit-shaped cross section is less than the substantially uniform width of the slit-shaped cross section, and wherein a second refractory metal used in the collar is the same as the refractory metal used in the first liner.

12. The structure of claim 11, wherein the second refractory metal selected from a group consisting of at least one of: tantalum (Ta), titanium (Ti), tungsten (W), ruthenium (Ru), iridium (Ir), rhodium (Rh) and platinum (Pt).

13. The structure of claim 11, wherein the dielectric layer includes a barrier layer forming the liner-less interface with the copper wire and an interlevel dielectric above the barrier layer.

14. The structure of claim 11, wherein the first liner comprises a single liner layer.

15. The structure of claim 14, wherein the single liner layer is formed from a single deposition process.

* * * * *